(12) United States Patent
Choi et al.

(10) Patent No.: US 11,817,414 B2
(45) Date of Patent: Nov. 14, 2023

(54) DISPLAY MODULE AND MANUFACTURING METHOD THEREOF

(71) Applicant: SAMSUNG ELECTRONICS CO., LTD., Suwon-si (KR)

(72) Inventors: Won Choi, Suwon-si (KR); Sangkyun Im, Suwon-si (KR); Sanghoon Roh, Suwon-si (KR); Jihyeon Son, Suwon-si (KR); Joowhan Lee, Suwon-si (KR); Hyuntae Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 156 days.

(21) Appl. No.: 17/368,194

(22) Filed: Jul. 6, 2021

(65) Prior Publication Data
US 2022/0013489 A1  Jan. 13, 2022

(30) Foreign Application Priority Data

Jul. 7, 2020  (KR) .................. 10-2020-0083689

(51) Int. Cl.
*H01L 23/00* (2006.01)
*H01L 33/60* (2010.01)
(Continued)

(52) U.S. Cl.
CPC .............. *H01L 24/29* (2013.01); *H01L 24/32* (2013.01); *H01L 24/83* (2013.01);
(Continued)

(58) Field of Classification Search
CPC ..... H01L 24/32; H01L 24/83; H01L 25/0753; H01L 33/60; H01L 33/62; H01L 24/29; H01L 24/16; H01L 24/13; H01L 24/06; H01L 24/73; H01L 24/48; H01L 33/647; H01L 24/97; H01L 25/13; H01L 33/56;
(Continued)

(56) References Cited

U.S. PATENT DOCUMENTS 8,444,882 B2  5/2013  Kanisawa et al.
9,799,634 B2  10/2017  Rhee
(Continued)

FOREIGN PATENT DOCUMENTS

CN  208767335 U  4/2019
KR  10-2009-0009136 A  1/2009
(Continued)

OTHER PUBLICATIONS

International Search Report (PCT/ISA/210) dated Oct. 25, 2021 by the International Searching Authority in counterpart International Patent Application No. PCT/KR2021/008301.
(Continued)

*Primary Examiner* — Mouloucoulaye Inoussa
(74) *Attorney, Agent, or Firm* — Sughrue Mion, PLLC

(57) ABSTRACT

A display module and a method for manufacturing thereof are provided. The display module includes a substrate including a pad, a conduction film which is bonded to the substrate including the pad, wherein at least one of a surface of the conduction film and an inner portion of the conduction film is black color treated, and a display device mounted on the pad to which the conduction film is bonded.

18 Claims, 15 Drawing Sheets

(51) Int. Cl.
*H01L 25/075* (2006.01)
*H01L 33/62* (2010.01)

(52) U.S. Cl.
CPC .......... *H01L 25/0753* (2013.01); *H01L 33/60* (2013.01); *H01L 33/62* (2013.01); *H01L 2224/2929* (2013.01); *H01L 2224/2957* (2013.01); *H01L 2224/29339* (2013.01); *H01L 2224/29344* (2013.01); *H01L 2224/29347* (2013.01); *H01L 2224/29355* (2013.01); *H01L 2224/29371* (2013.01); *H01L 2224/29411* (2013.01); *H01L 2224/29439* (2013.01); *H01L 2224/29455* (2013.01); *H01L 2224/29499* (2013.01); *H01L 2224/32227* (2013.01); *H01L 2224/8302* (2013.01); *H01L 2224/83091* (2013.01); *H01L 2224/83099* (2013.01); *H01L 2224/83192* (2013.01); *H01L 2224/83851* (2013.01); *H01L 2924/12041* (2013.01); *H01L 2924/20105* (2013.01)

(58) Field of Classification Search
CPC ... H01L 27/1218; H01L 27/156; H01L 33/54; H01L 25/167; H01L 33/52; H01L 25/162; H01L 25/165; H01L 23/552; H01L 2224/83385; H01L 2924/12041; H01L 2224/8385; H01L 2933/0058; H01L 2224/83091; H01L 2224/83851; H01L 2224/83192; H01L 2224/29339; H01L 2224/29347; H01L 2924/20105; H01L 2224/29455; H01L 2224/83099; H01L 2224/29444; H01L 2224/83399; H01L 2224/2929; H01L 2224/29499; H01L 2224/8302; H01L 2224/2939; H01L 2224/2957; H01L 2924/14; H01L 2224/29355; H01L 2933/0066; H01L 2224/29439; H01L 2224/29371; H01L 2224/32225; H01L 2224/29344; H01L 2224/29411; H01L 2224/32227; H01L 2924/00014; H01L 2924/0132; H01L 2924/01028; H01L 2924/01074; H01L 2924/0665; H01L 2924/10329; H01L 2924/15156; H01L 2224/8388; H01L 2224/04105; H01L 2224/16105; H01L 2924/10331; H01L 2224/9512; H01L 2224/951; H01L 2924/15159; H01L 2924/15311; H01L 2924/3025; H01L 2224/97; H01L 2224/48227; H01L 2224/85; H05K 1/181; H05K 9/0071; H05K 9/0083; H05K 9/0092; H05K 9/0088; H05K 9/0022; H05K 2201/10136; H05K 2201/10128; G02F 1/13336; B32B 27/18; B32B 7/025
USPC .... 257/659, 89, E23.012, E21.499; 438/108, 438/27; 359/296; 445/24; 345/107; 427/66, 558
See application file for complete search history.

(56) References Cited

U.S. PATENT DOCUMENTS

| | | | |
|---|---|---|---|
| 10,304,901 B1 | 5/2019 | Xu et al. | |
| 10,886,446 B2 | 1/2021 | Ahn et al. | |
| 11,088,304 B2 | 8/2021 | Han et al. | |
| 11,282,820 B2 | 3/2022 | Takeya et al. | |
| 2002/0024620 A1* | 2/2002 | Miyamoto | G02F 1/1679 349/2 |
| 2003/0090204 A1* | 5/2003 | Joo | H01J 11/24 313/582 |
| 2006/0087719 A1* | 4/2006 | Kosuge | G02B 26/026 359/296 |
| 2006/0139733 A1* | 6/2006 | Lee | G02F 1/167 359/296 |
| 2007/0297039 A1* | 12/2007 | Lee | G02F 1/133377 359/296 |
| 2008/0012477 A1* | 1/2008 | Koo | H10K 50/87 445/24 |
| 2008/0024432 A1* | 1/2008 | Lee | G02F 1/1677 345/107 |
| 2008/0094688 A1* | 4/2008 | Baesjou | G02F 1/167 345/107 |
| 2008/0186259 A1* | 8/2008 | Todorokihara | G02F 1/167 345/76 |
| 2008/0198441 A1* | 8/2008 | Cho | G02F 1/091 359/281 |
| 2008/0278795 A1* | 11/2008 | Kim | B82Y 20/00 204/157.4 |
| 2009/0078938 A1* | 3/2009 | Yamazaki | H01L 27/1266 257/E21.414 |
| 2009/0153946 A1* | 6/2009 | Nakamura | G02F 1/167 359/296 |
| 2009/0200522 A1* | 8/2009 | Nakatani | C22C 11/00 252/514 |
| 2009/0207477 A1* | 8/2009 | Komatsu | G02F 1/16755 156/276 |
| 2009/0278162 A1 | 11/2009 | Wang et al. | |
| 2010/0127966 A1* | 5/2010 | Miyamoto | G09G 3/344 345/107 |
| 2010/0156779 A1* | 6/2010 | Park | G02F 1/167 438/22 |
| 2010/0195187 A1* | 8/2010 | Nam | G02F 1/1677 445/24 |
| 2010/0225575 A1* | 9/2010 | Ishii | H01B 1/122 252/500 |
| 2010/0225997 A1* | 9/2010 | Yamamoto | G02F 1/167 204/450 |
| 2010/0225998 A1* | 9/2010 | Yamamoto | G02F 1/167 204/450 |
| 2010/0245982 A1* | 9/2010 | Akashi | G02F 1/167 252/500 |
| 2011/0012825 A1* | 1/2011 | Walls | G02F 1/167 204/549 |
| 2011/0025681 A1* | 2/2011 | Komatsu | G02F 1/167 345/107 |
| 2011/0026099 A1* | 2/2011 | Kwon | G02F 1/133516 445/24 |
| 2011/0090143 A1* | 4/2011 | Paek | G02F 1/1679 257/E33.056 |
| 2011/0205195 A1* | 8/2011 | Komatsu | G09G 3/344 345/204 |
| 2011/0255145 A1* | 10/2011 | Masuzawa | G02F 1/1675 359/296 |
| 2011/0261042 A1* | 10/2011 | Umezaki | G09G 3/344 345/107 |
| 2011/0309481 A1* | 12/2011 | Huang | H01L 21/563 257/659 |
| 2012/0013968 A1* | 1/2012 | Park | G02F 1/167 257/E33.056 |
| 2012/0038852 A1* | 2/2012 | Jang | G02F 1/1334 349/86 |
| 2012/0068990 A1* | 3/2012 | Moriyama | C08F 290/068 345/212 |
| 2012/0069064 A1* | 3/2012 | Yamakita | H10K 59/50 445/24 |
| 2012/0069423 A1* | 3/2012 | Moriyama | C08L 51/085 359/296 |
| 2012/0073116 A1* | 3/2012 | Lim | G02F 1/167 29/592.1 |
| 2012/0092753 A1* | 4/2012 | Heikenfeld | C09B 67/009 977/773 |
| 2012/0099181 A1* | 4/2012 | Shitagami | G02F 1/1679 445/25 |

(56) References Cited

U.S. PATENT DOCUMENTS

| | | | |
|---|---|---|---|
| 2012/0127561 A1* | 5/2012 | Nishida | G02F 1/167 359/296 |
| 2012/0200910 A1* | 8/2012 | Hayashi | G02F 1/167 156/196 |
| 2013/0020014 A1* | 1/2013 | Shin | G02F 1/167 427/532 |
| 2013/0144777 A1* | 6/2013 | Haggerty | G06Q 40/00 705/38 |
| 2013/0182312 A1* | 7/2013 | Yamamoto | G02F 1/167 359/296 |
| 2014/0185128 A1* | 7/2014 | Lo | G02F 1/1677 445/25 |
| 2014/0232621 A1* | 8/2014 | Chung | G02B 26/005 359/290 |
| 2014/0240816 A1* | 8/2014 | Kinoshita | G02B 5/22 359/885 |
| 2015/0054008 A1 | 2/2015 | Rhee | |
| 2015/0098123 A1* | 4/2015 | Shitagami | G02F 1/167 156/146 |
| 2015/0116985 A1 | 4/2015 | Bang | |
| 2015/0168798 A1* | 6/2015 | Yamashita | B41J 3/4076 359/296 |
| 2015/0228617 A1 | 8/2015 | Lee et al. | |
| 2015/0249069 A1* | 9/2015 | Yoshida | H01L 33/505 257/89 |
| 2015/0268492 A1* | 9/2015 | Hino | G02F 1/1336 445/24 |
| 2016/0033844 A1* | 2/2016 | Gan | G02F 1/167 359/296 |
| 2016/0043061 A1 | 2/2016 | Rhee | |
| 2016/0163940 A1 | 6/2016 | Huang et al. | |
| 2016/0187756 A1* | 6/2016 | Liu | G02F 1/167 252/500 |
| 2017/0271290 A1* | 9/2017 | Liao | H01L 24/16 |
| 2017/0357116 A1* | 12/2017 | Harris | G02F 1/133305 |
| 2018/0226384 A1 | 8/2018 | Park et al. | |
| 2018/0236777 A1* | 8/2018 | Hirabayashi | B41M 5/52 |
| 2019/0304346 A1 | 10/2019 | Choi | |
| 2020/0058834 A1* | 2/2020 | Park | H01L 33/56 |
| 2020/0075820 A1 | 3/2020 | Han et al. | |
| 2020/0193669 A1* | 6/2020 | Churchill | G06V 40/103 |
| 2020/0193895 A1* | 6/2020 | Shao | H05K 1/0274 |
| 2020/0400862 A1* | 12/2020 | Kamo | H01L 25/0753 |
| 2021/0005588 A1* | 1/2021 | Chung | H01L 24/95 |
| 2021/0183837 A1* | 6/2021 | Shin | H01L 25/167 |
| 2021/0251111 A1* | 8/2021 | Mori | B32B 27/18 |
| 2021/0265327 A1* | 8/2021 | Koo | H01L 25/13 |
| 2021/0317326 A1* | 10/2021 | Doherty | C09D 11/322 |
| 2022/0077226 A1* | 3/2022 | Chang | H01L 27/156 |
| 2022/0293669 A1* | 9/2022 | Park | H01L 33/58 |

FOREIGN PATENT DOCUMENTS

| | | |
|---|---|---|
| KR | 10-2011-0131018 A | 12/2011 |
| KR | 10-1476207 B1 | 12/2014 |
| KR | 10-1476686 B1 | 12/2014 |
| KR | 10-2018-0000038 A | 1/2018 |
| KR | 10-2020-0015082 A | 2/2020 |
| KR | 10-2020-0027891 A | 3/2020 |

OTHER PUBLICATIONS

Written Opinion (PCT/ISA/237) dated Oct. 25, 2021 by the International Searching Authority in counterpart International Patent Application No. PCT/KR2021/008301.

Communication dated Jan. 1, 2023 issued by the European Patent Office in European Patent Application No. 21836940.3.

\* cited by examiner

DISPLAY MODULE AND MANUFACTURING METHOD THEREOF

CROSS-REFERENCE TO RELATED APPLICATION

This application is based on and claims priority under 35 U.S.C. § 119 to Korean patent application number 10-2020-0083689, filed on Jul. 7, 2020, in the Korean Intellectual Property Office, the disclosure of which is incorporated by reference herein in its entirety.

BACKGROUND

1. Field

The disclosure relates to a display module and a manufacturing method thereof. More particularly, the disclosure relates to a display module capable of providing a screen with a deep black color representation and a manufacturing method thereof.

2. Description of Related Art

FIG. 1 is a diagram illustrating a display module of the related art. Referring to FIG. 1, the display module may include a sapphire (e.g., LED) mounted on a printed circuit board (PCB) and a black side fill 10 applied around the sapphire. The black side fill 10 may be an area in which a black color liquid is applied, and thereby the printed circuit board may be realized in a black color, and the display module may able to provide a screen with a black color representation.

However, the black side fill 10 has the disadvantage of being applied to the side surfaces of the sapphire as well as the surface of the PCB due to liquid characteristics in the process of being applied to the surface of the PCB (specifically, a surface of a photo imageable solder resist (PSR)). The above is disadvantageous for creating problems such as degrading light efficiency of the display module as light emitted by the sapphire (specifically, light 20-1 and 20-2 emitted toward the side surface of the sapphire) is absorbed by the black side fill 10.

SUMMARY

Provided is a display module which provides a screen with a deep black color representation that does not degrade light efficiency, and a manufacturing method thereof.

In accordance with an aspect of the disclosure, a display module includes a substrate comprising a pad; a conduction film bonded to the substrate, wherein at least one of a surface of the conduction film and an inner portion of the conduction film is black color treated; and a display device mounted on the pad to which the conduction film is bonded.

The surface of the conduction film may include a black color pattern, and the black color pattern may be formed based on a black color liquid sprayed to the surface of the conduction film through an inkjet process or a dispensing process.

The inner portion of the conduction film may include a black color powder.

The black color powder may include a chromium alloyed Cr-Copper material.

The conduction film may include a resin and a plurality of conduction particles uniformly distributed in the resin.

The conduction film may include a plurality of conduction particles only in an area which is bonded to the pad of the substrate.

Each of the plurality of conduction particles may be coated with a material which reflects light emitted by the display device.

A surface of each of the plurality of conduction particles may be coated with nickel, silver or tin.

In accordance with an aspect of the disclosure, a method of manufacturing a display module includes bonding a conduction film to a substrate that includes a pad, wherein at least one of a surface of the conduction film and an inner portion of the conduction film is black color treated; and mounting a display device on the pad to which the conduction film is bonded.

The surface of the conduction film may include a black color pattern, and the black color pattern may be formed based on a black color liquid sprayed to the surface of the conduction film through an inkjet process or a dispensing process.

The inner portion of the conduction film may include a black color powder.

The black color powder may include a chromium alloyed Cr-Copper material.

The conduction film may include a resin and a plurality of conduction particles uniformly distributed in the resin.

The conduction film may include a plurality of conduction particles only in an area which is bonded to the pad of the substrate.

Each of the plurality of conduction particles may be coated with a material which reflects light emitted by the display device.

A surface of each of the plurality of conduction particles may be coated with nickel, silver or tin.

In accordance with an aspect of the disclosure, a printed circuit board includes a pad configured to be adhered to an electronic component; and a conduction film bonded to the pad, wherein at least one of a surface of the conduction film and an inner portion of the conduction film is black color treated.

The surface of the conduction film may include a black color pattern, and the black color pattern may be formed based on a black color liquid sprayed to the surface of the conduction film through an inkjet process or a dispensing process.

The inner portion of the conduction film may include a black color powder.

The black color powder may include a chromium alloyed Cr-Copper material.

In accordance with an aspect of the disclosure, a printed circuit board includes a substrate; a plurality of pads formed on the substrate; an insulating material formed on the substrate between the plurality of pads; and a conduction film formed on the plurality of pads and on the insulating material.

The conduction film may include a resin and a plurality of conduction particles dispersed in the resin.

The printed circuit board may further include a black color layer on an exposed surface of the conduction film.

The conduction film may include a resin and a black powder dispersed in the resin.

BRIEF DESCRIPTION OF THE DRAWINGS

The above and other aspects, features and advantages of certain embodiments of the present disclosure will be more apparent from the following description taken in conjunction with the accompanying drawings, in which.

DETAILED DESCRIPTION

Terms used in describing the one or more example embodiments of the disclosure are general terms selected taking into consideration their function herein. However, the terms may change depending on intention, legal or technical interpretation, emergence of new technologies, and the like of those skilled in the related art. Further, in certain cases, there may be terms arbitrarily selected. In this case, the meaning of the term may be interpreted as defined in the description, or may be interpreted based on the overall context of the disclosure and the technical common sense according to the related art, unless otherwise specified.

In addition, in describing the disclosure, in case it is determined that the detailed description of related known technologies may unnecessarily confuse the gist of the disclosure, the detailed description thereof will summed up or omitted.

Further, although embodiments of the disclosure are described in detail below with reference to the accompanying drawings and the descriptions of the accompanying drawings, the disclosure is not limited to the embodiments.

The disclosure will be described in detail below with reference to the accompanying drawings.

Figure 2:
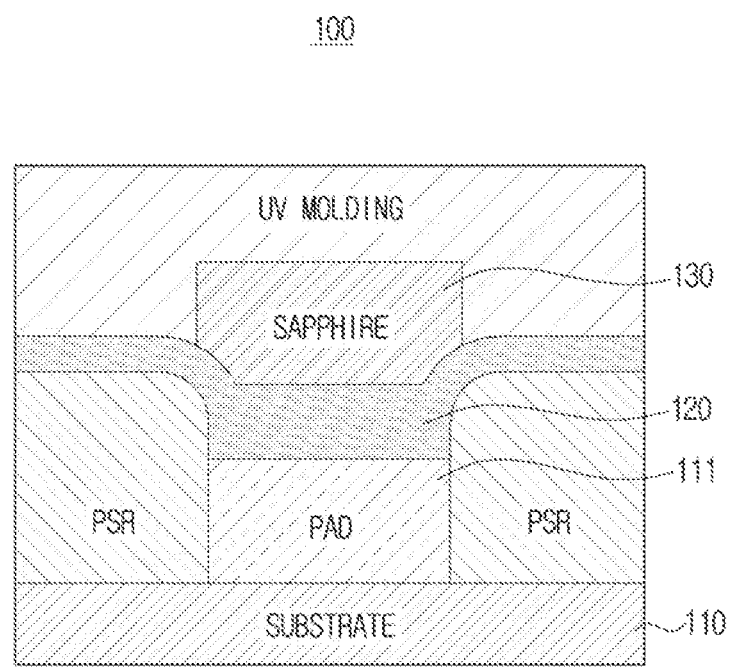
FIG. 2 is a diagram illustrating a display module according to an embodiment.

FIG. 2 is a diagram illustrating a display module according to an embodiment.

Referring to FIG. 2, the display module 100 according to an embodiment may include a substrate 110 including a pad 111, a conduction film 120 adhered on the substrate 110, and a display device 130 mounted to the pad 111. As illustrated in FIG. 2, the display device 130 may be referred to as a sapphire according to an embodiment.

The conduction film 120 may be a film including a plurality of conduction particles, and according to an embodiment, the conduction film 120 may be an anisotropic conduction film (ACF). Specifically, the conduction film 120 may be an adhesive of a film type in which metal particles (i.e., conduction particles) such as nickel (Ni), gold (Au) or silver (Ag) are dispersed in resin such as epoxy or an adhesive of a film type in which a polymer coated with the above-described metal particles are dispersed in resin such as epoxy. Each of the conduction particles may have a diameter of several µm (e.g., 2 to 4 µm), and the conduction particles may be dispersed in an electrical insulating resin (e.g., thermosetting resin and/or thermoplastic resin).

The conduction film 120 may be configured to electrically connect two or more electronic components, for example, the pad 111 on the substrate and the display device 130 which is mounted to the pad 111. Specifically, when the display device 130 is bonded to the conduction film 120 on the pad 111 under a predetermined temperature and pressure condition (e.g., temperature of 170° C., pressure of 5.0 MPa), the conduction film 120 may be pressed in a high temperature state and the thickness may be reduced. Accordingly, the plurality of conduction particles inside the conduction film 120, which is positioned between the display device 130 and the pad 111, may be in contact or adhered to one another, and the display device 130 and the pad 111 may be electrically connected through the plurality of conduction particles which are in contact or adhered to one another.

Electronic components such as the display device 130 may be mounted onto the pad 111, and the pad 111 may electrically connect a pattern or wiring designed on the surface of the substrate 110 to the display device 130. Specifically, the pad 111 may be electrically connected to the display device 130 through the conduction film 120 as described above. Then, the pad 111 may be configured to receive a driving signal (e.g., an LED driving signal) from a processor or a current sink circuit through the pattern designed on the surface of the substrate 110, and transmit the driving signal to the display device 130 which is electrically connected through the conduction film 120.

The display device 130 may emit light, and in an example, may be a light emitting diode (LED). However, embodiments are not limited thereto, and the display device 130 may be a variety of display devices such as an organic light emitting diode (OLED), a liquid crystal display (LCD) panel, or the like. In addition, the display device 130 may be a micro LED with a pixel size of less than or equal to 5 to 100 µm. In the above, the display device 130 has been described as being mounted on the pad 111 to which the conduction film 120 is bonded, but other electronic components such as an integrated circuit (IC) chip, or the like may be mounted on the pad 111 according to an embodiment.

Additionally, the display module 100 may further include, as illustrated in FIG. 2, a photo imageable solder resist (PSR) and a UV molding layer. The PSR may be an insulating material which is applied on the substrate 110 to prevent oxidation and contamination of a circuitry a or pattern on the substrate 110. The PSR may be formed by applying of permanent ink. According to an embodiment, a layer including the substrate 110, the pad 111, and the PSR may be referred to as a printed circuit board (PCB). Further, the UV molding may be a layer which fills the surrounding of the display device 130 with a functional resin after the mounting of the display device 130, and may function to prevent the oxidation and contamination of the display device 130, and fix the display device 130.

Figure 3:
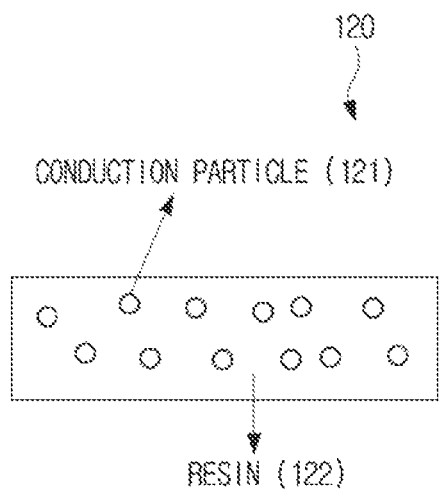
FIG. 3 is a diagram illustrating a conduction film according to an embodiment.

FIG. 3 is a diagram illustrating a conduction film according to an embodiment.

Referring to FIG. 3, the conduction film 120 according to an embodiment may include a plurality of conduction particles 121 distributed in a resin 122.

Each of the conduction particles 121 may be a conduction ball (e.g., nickel ball) which is formed of metal materials such as nickel (Ni), gold (Au), silver (Ag), or the like, and may also be a polymer ball (e.g., Au-plated polymer ball) which is coated with metal materials such as gold (Au) on the surface.

Accordingly, the conduction particles 121 may be distributed uniformly throughout the whole area of the conduction film 120. Further, the distance between the plurality of conduction particles 121 may be the same, or may be different according to an embodiment.

In addition, the conduction particles 121 may be distributed to some areas of the conduction film 120 without being distributed to other areas of the conduction film 120. The detailed description thereof will be described below with reference to FIG. 11 and FIG. 12.

Further, the shape of the conduction particles 121 may be spherical as illustrated in FIG. 3. In an example, the conduction particle 121 may be a spherical particle having a diameter between 2 and 4 μm. However, this is merely one embodiment, and the conduction particles 121 may be realized to various shapes such as, for example, and without limitation, amorphous, elliptical, needle, or the like. In an example, the elliptical conduction particle 121 may be a particle in which a length of a major axis is 1 to 50 μm, and a thickness is 0.1 to 5 μm.

The resin 122 may be a thermosetting resin such as epoxy. In an example, the resin 122 may be an alicyclic epoxy resin, a hydrogenated epoxy resin, or the like. In addition, the resin 122 according to an embodiment may be mixed with a crosslinking agent such as acid anhydride, imidazole compound, dicyan, and the like.

Accordingly, based on undergoing a heating and pressing process of a certain condition after being positioned between the electronic components or circuitry for connecting the conduction film 120, the electronic components may be electrically connected by the plurality of conduction particles 121. In an example, based on applying a predetermined pressure (e.g., 5.0 MPa) from an upper side of the display device 130 to a lower side at which the pad 111 is positioned under the condition of a pre-determined temperature (e.g., 170° C.), the conduction film 120 may be pressed in the high temperature state and the thickness may be reduced. Thus, the plurality of conduction particles 121 positioned between the display device 130 and the pad 111 may be pressed into contact and adhered to one another, and accordingly, the display device 130 and the pad 111 may be electrically connected with each other. In this case, because the plurality of conduction particles 121 are not in contact with one another in a horizontal direction, insulation in a vertical direction may be maintained.

The above-described conduction film 120 may be manufactured according to a known manufacturing process technology. In an example, the conduction film 120 may be manufactured through a first process of mixing the plurality of conduction particles 121 and the resin 122 through a binder and a second process of drying (e.g., hot-air drying at 70 to 100° C.) after coating a mixed solution in which the plurality of conduction particles 121 and the resin 122 are mixed on a base film (e.g., release film). According to an embodiment, the manufacturing process of the conduction film 120 may further include a slitting process or the like of cutting the conduction film 120 into a shape having a pre-determined measurement.

The embodiment may include the process of black color treating at least one from among the surface and the inside (i.e., inner portion) of the conduction film 120 to implement the conduction film 120 in the black color.

Figure 4:
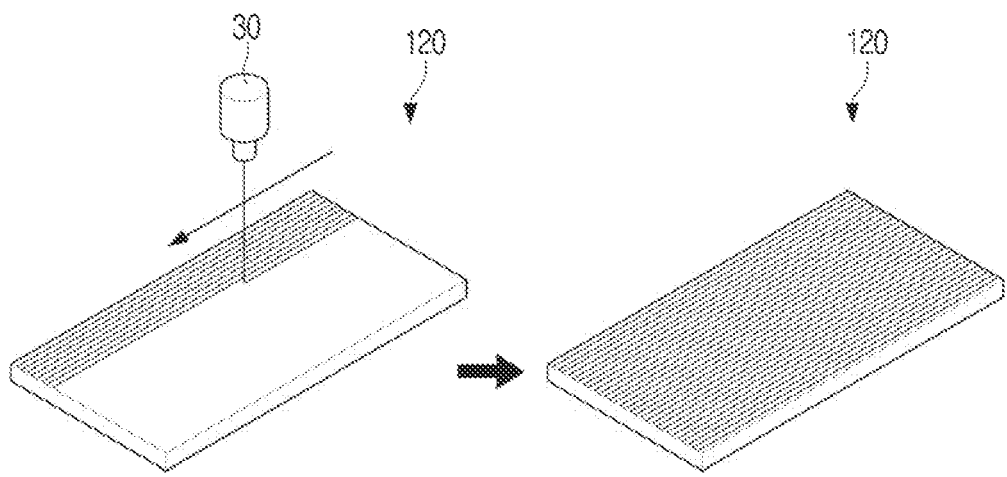
FIG. 4 is a diagram illustrating an embodiment of black color treating a surface of a conduction film according to an embodiment.

FIG. 4 is a diagram illustrating an embodiment of black color treating a surface of a conduction film according to an embodiment. The above will be described below with reference to FIG. 4, and the like.

As described above, the conduction film 120 may be manufactured through the first process of mixing the plurality of conduction particles 121 and the resin 122 through the binder and the second process of drying (e.g., hot-air drying at 70 to 100° C.) after coating the mixed solution in which the plurality of conduction particles 121 and the resin 122 are mixed on the base film (e.g., release film).

However, the color of the conduction film manufactured as described above is substantially transparent, and the display module 100 to which the conduction film described above is bonded has the problem of not being able to provide a screen with a deep black color representation.

To solve the problem described above, in the embodiment, the surface of the conduction film 120 may be black color treated.

In an example, the surface of the conduction film 120 may be black color treated through an inkjet process. Specifically, referring to FIG. 4, the surface of the conduction film 120 may be black color treated based on a black color liquid (or, ink) sprayed through a nozzle of an inkjet printer head 30.

The black color liquid may be a liquid in which a black powder is mixed therein, and according to an embodiment, the black color liquid may be a liquid in which Cr-Copper is dispersed in epoxy resin.

The above-described inkjet process may include a first process of spraying the black color liquid to the surface of the conduction film 120 through the nozzle of the inkjet printer head 30, a second process of drying the black color liquid on the surface of the conduction film 120, and a third process of curing by heat treating the black color liquid on the surface of the conduction film 120. The inkjet process as described above may be referred to as a patterning process according to an embodiment.

In an example, the black pattern (i.e., black color layer) formed on the surface of the conduction film 120 according to the inkjet process may be formed of lines each with a thickness of 20 to 25 μm, and the distance between the lines may be 4 to 5 μm, but embodiments are not limited thereto.

Although FIG. 4 illustrates an embodiment according to a non-contact type inkjet process, the inkjet process according to an embodiment may be a contact type inkjet process. In an example, the inkjet process may be a process of patterning the surface of the conduction film 120 to a black color pattern through a roll-to-roll (R2R) printing method.

In addition, although FIG. 4 illustrates the black pattern formed in a vertical direction, this is merely an embodiment. According to an embodiment, the black pattern may be formed in a horizontal direction as well as in a lattice pattern.

In addition, the above-described inkjet process is merely an embodiment, and the surface of the conduction film 120 may be black color treated through various methods.

In an example, the surface of the conduction film 120 may be black color treated through a dispensing process. In this case, the black color liquid (or ink) may be sprayed on the surface of the conduction film 120 through a dispenser. The dispenser may include a screw driven by a motor, and may be configured to spray the black color liquid on the conduction film 120 through a needle by rotating the screw according to a rotation of the motor. Then, the conduction film 120 on which the black color liquid is sprayed may undergo a drying process and a curing process, and accordingly, a black color pattern may be formed on the surface of the conduction film 120.

Figure 5:
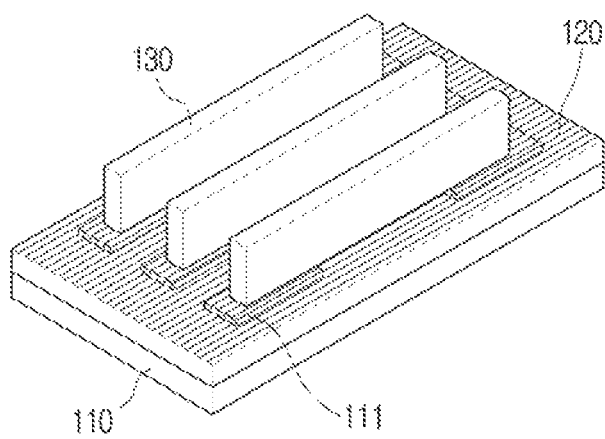
FIG. 5 is a diagram illustrating a display module including a conduction film of which a surface is black color treated according to an embodiment.

Then, as illustrated in FIG. 5, the conduction film 120 of which the surface is black color treated may be positioned between the display 130 and the substrate 110 including the pad 111 and then, after undergoing the heating and pressing process of a certain condition, the pad 111 and the display device 130 may be electrically connected to each other by the plurality of conduction particles 121 of the conduction film 120.

Accordingly, the display module 100 according to an embodiment may be configured to provide a screen with a deep black color representation through the conduction film 120 of which the surface is black color treated even without a black side fill, and the problem of light efficiency degradation which may be generated by the black side fill may be resolved.

Figure 1:
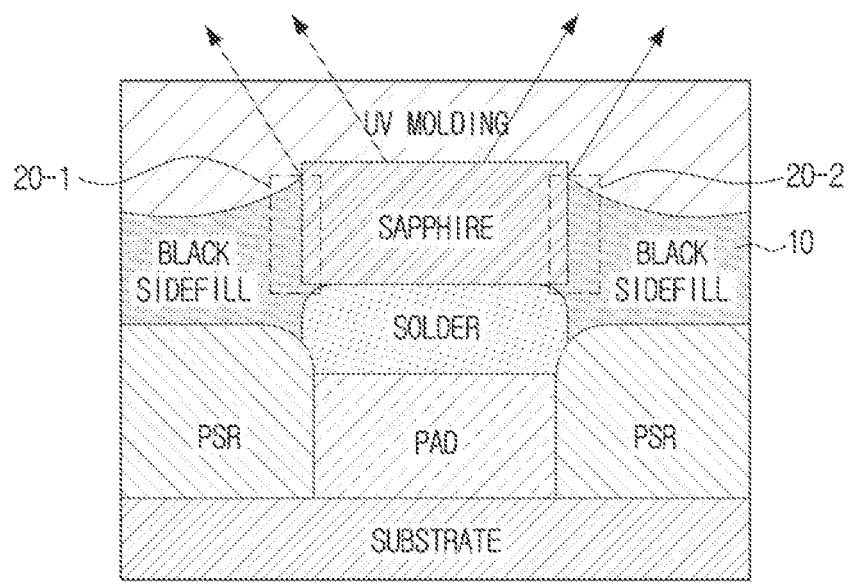
FIG. 1 is a diagram illustrating a display module of the related art.
Figure 6:
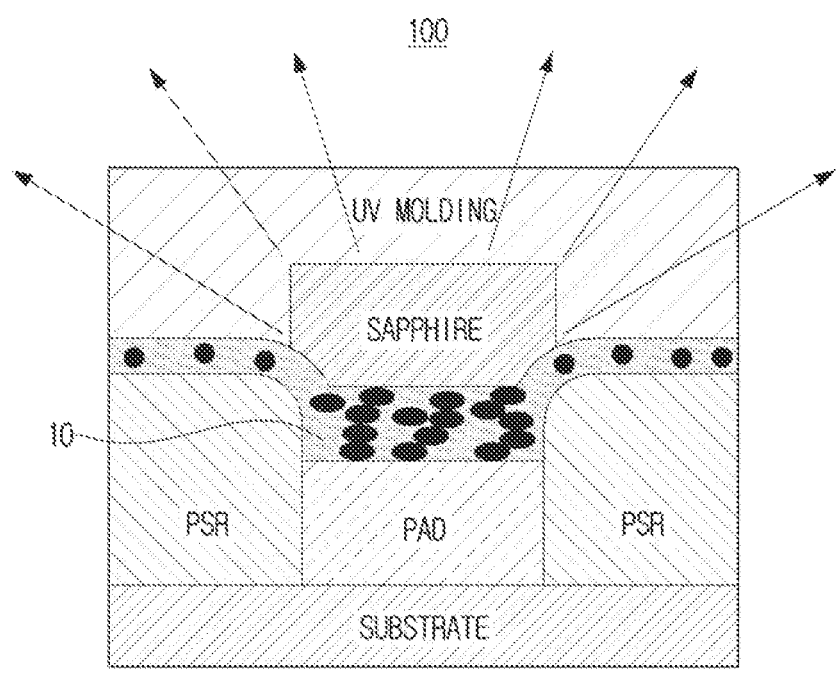
FIG. 6 is a diagram illustrating a cross-sectional view of a display module according to an embodiment.

In an example, based on comparing FIG. 6 which illustrates a cross-sectional view of a display module 100 according to an embodiment with FIG. 1 which illustrates a cross-sectional view of a display module of the related art, the display module of the related art has the problem of light 20-1 and 20-2 which is emitted to the side surface of the sapphire being absorbed by the black side fill 10 due to the black side fill applied to the side surface of the sapphire. However, the display module 100 according to an embodiment of the disclosure may prevent the problem of light emitted by the sapphire being absorbed by the black side fill because of the sapphire being bonded to the conduction film 120 which is black color treated, and further provide a screen with a deep black color representation through the conduction film 120 which is black color treated.

Figure 7:
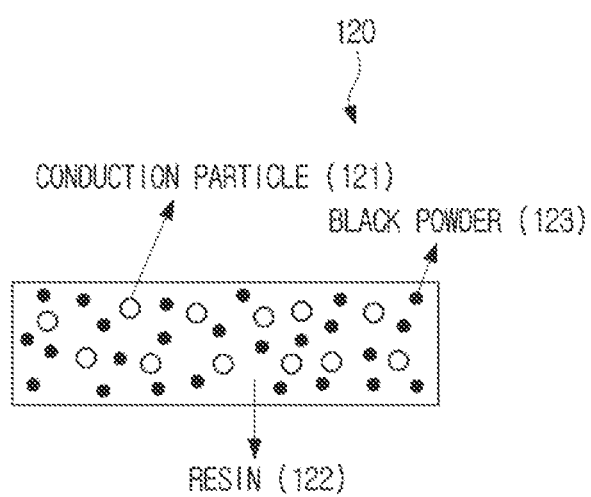
FIG. 7 is a diagram illustrating black color treating an inside of a conduction film according to an embodiment.

FIG. 7 is a diagram illustrating black color treating an inside of a conduction film according to an embodiment.

Referring to FIG. 7, the conduction film 120 according to an embodiment may include the plurality of conduction particles 121 and a plurality of black powder particles 123 which are dispersed in the resin 122.

Each conduction particle 121 may be a conduction ball formed of metal materials such as nickel (Ni), gold (Au), silver (Ag), and the like, and may also be a polymer ball (e.g., Au-plated polymer ball) which is coated with metal materials such as gold (Au) on the surface.

The resin 122 may be a thermosetting resin such as epoxy. In addition, the resin 122 according to an embodiment may further include a crosslinking agent such as acid anhydride, imidazole compound, dicyan, and the like.

Further, the black powder particles 123 may be, as an example, a chromium alloyed Cr-Copper. However, embodiments are not limited thereto, and the black powder particles 123 may be dispersed in resin 122 with the plurality of conduction particles 121, and any material may be used so long as it is a powder which may realize the color of the mixed solution in which the plurality of conduction particles 121, the resin 122, and the black powder particles 123 is mixed as black.

In addition, the diameter of the black powder particles 123 may be, in an example, between 0.5 to 1 μm, but is not limited thereto.

The conduction film 120 as described above may be manufactured through the first process of mixing the plurality of conduction particles 121, the plurality of black powder particles 123, and the resin 122 through the binder and the second process of drying (e.g., hot-air drying at 70 to 100° C.) after coating the mixed solution in which the plurality of conduction particles 121, the plurality of black powder particles 123, and the resin 122 are mixed on the base film (e.g., release film). According to an embodiment, the manufacturing process of the conduction film 120 may further include the slitting process or the like of cutting the conduction film 120 into a shape with a pre-determined measurement.

Figure 8:
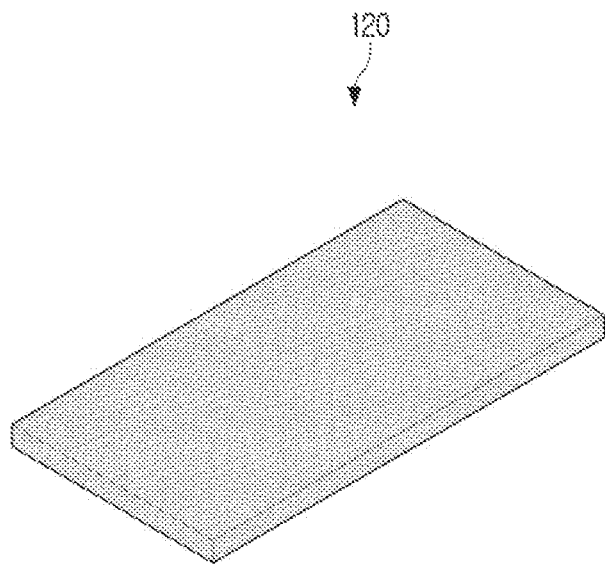
FIG. 8 is a diagram illustrating a conduction film in which an inside is black color treated according to an embodiment.

Accordingly, the conduction film 120 according to an embodiment may be black color treated as in FIG. 8. When compared with the embodiment of FIG. 4 which black color treats the surface of the conduction film 120, FIG. 8 shows that the conduction film 120 itself is implemented in black color based on the inside of the conduction film 120 being black color treated.

Figure 9:
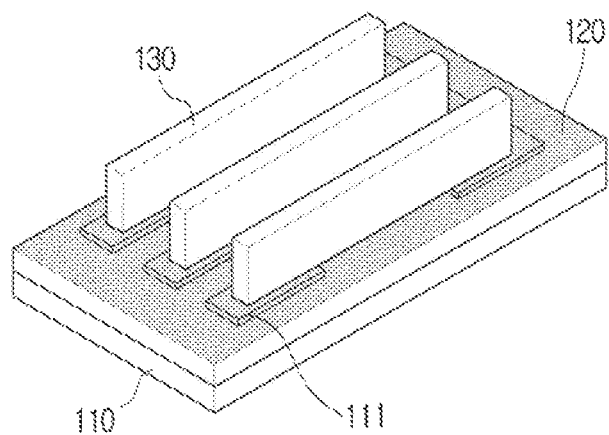
FIG. 9 is a diagram illustrating a display module including a conduction film in which an inside is black color treated according to an embodiment.

Then, as illustrated in FIG. 9, the black color treated conduction film 120 may be positioned between the display device 130 and the substrate 110 including the pad 111 and then, after undergoing the heating and pressing process of a certain condition, the pad 111 and the display device 130 may be electrically connected to each other by the plurality of conduction particles 121 of the conduction film 120.

Accordingly, the display module 100 according to an embodiment may be configured to provide a screen with a deep black color representation through the conduction film 120 of which the inside is black color treated even without the black side fill, and the problem of light efficiency degradation which may be generated by the black side fill may be resolved.

Figure 10:
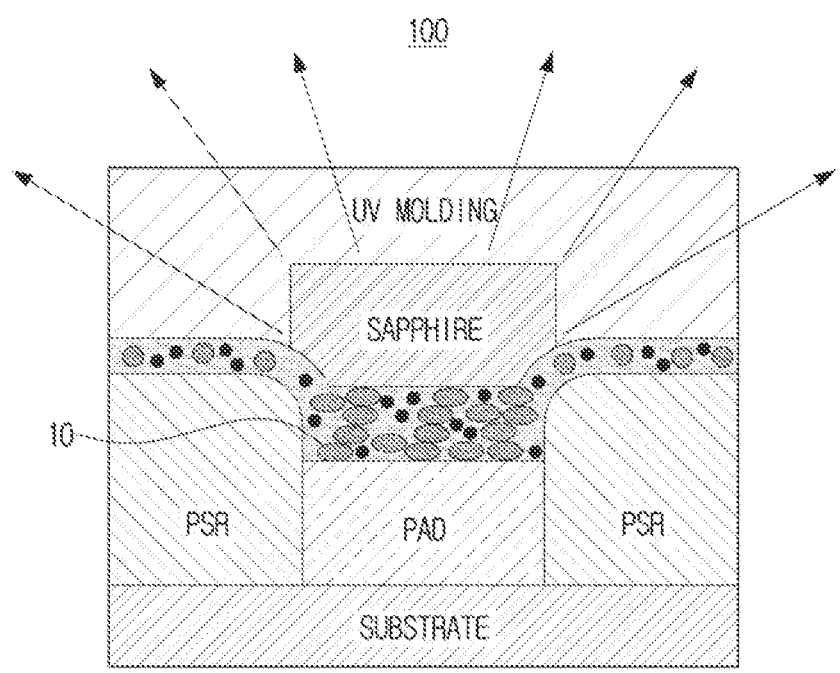
FIG. 10 is a diagram illustrating a cross-sectional view of a display module according to an embodiment.

In an example, based on comparing FIG. 10 which illustrates a cross-sectional view of a display module 100 according to an embodiment with FIG. 1 which illustrates a cross-sectional view of a display module of prior art, the display module of the prior art has the problem of light 20-1 and 20-2 which is emitted to the side surface of the sapphire being absorbed by the black side fill 10 due to the black side fill applied to the side surface of the sapphire. However, the display module 100 according to the disclosure may resolve the problem of light emitted by the sapphire being absorbed by the black side fill because of the sapphire being bonded to the conduction film 120 of which the inside is black color treated, and further provide a screen with a deep black color representation through the conduction film 120 which is black color treated.

Figure 11:
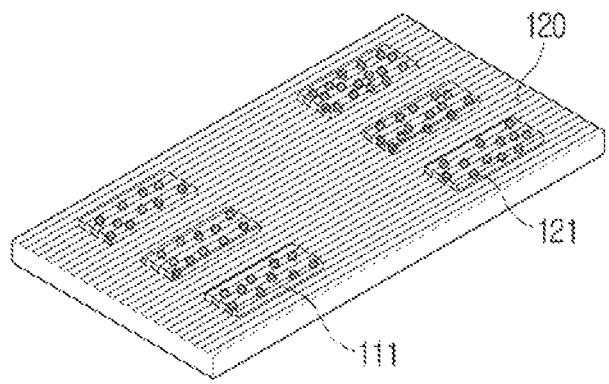
FIG. 11 is a diagram illustrating conduction particles being distributed to some areas of a conduction film formed with a black pattern according to an embodiment.
Figure 12:
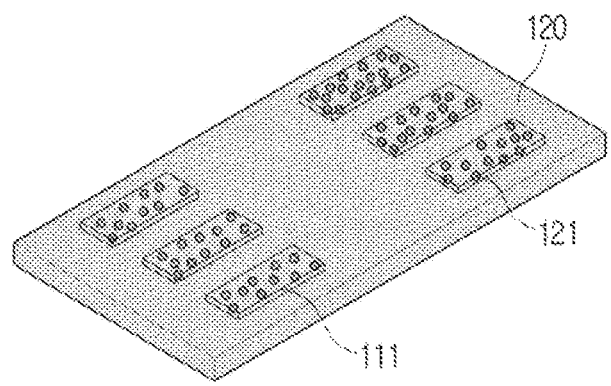
FIG. 12 is a diagram illustrating conduction particles being distributed to some areas of a conduction film including black powder particles according to an embodiment.

FIG. 11 is a diagram illustrating an embodiment of conduction particles being distributed to some areas of a conduction film formed with a black pattern according to an embodiment, and FIG. 12 is a diagram illustrating an embodiment of conduction particles being distributed to some areas of a conduction film including black powder particles according to an embodiment.

In the above, the conduction particles 121 have been described as being distributed throughout the whole area of the conduction film 120. However, the conduction particles 121 according to an embodiment may be distributed to only a portion of the area of the conduction film 120.

Specifically, the conduction particles 121 may be distributed to an area which is bonded with the pad 111 on the substrate 110, and conduction particles may not be included in any of the remaining areas excluding the corresponding area.

To this end, the conduction film 120 may be manufactured according to the manufacturing process as described below. Specifically, the conduction film 120 may be manufactured through the first process of mixing the plurality of conduction particles 121 and the resin 122 through the binder and the second process of drying (e.g., hot-air drying at 70 to 100° C.) after coating the mixed solution in which the plurality of conduction particles 121 and the resin 122 are mixed on an area which is bonded with the pad 111 from among the whole area of the base film (e.g., release film).

In order to coat the mixed solution to an area bonded with the pad 111 from among the whole area of the base film, a conduction film manufacturing machine may be stored with information on the size of the pad 111 and the distance between the plurality of pads 111. Specifically, the conduction film manufacturing machine may be stored with information on a distance between a pad to which a cathode electrode of a R sub pixel is contacted and a pad to which an anode electrode of the R sub pixel is contacted, a distance between a pad to which a cathode electrode of a G sub pixel is contacted and a pad to which an anode electrode of a G sub pixel is contacted, a distance between a pad to which a cathode electrode of a B sub pixel is contacted and a pad to which an anode electrode of a B sub pixel is contacted, a distance between a pad to which the cathode electrode of the R sub pixel is contacted and a pad to which the cathode electrode of the G sub pixel is contacted, a distance between a pad to which the cathode electrode of the G sub pixel is contacted and a pad to which the cathode electrode of the B sub pixel is contacted, a distance between a pad to which the anode electrode of the R sub pixel is contacted and a pad to which the anode electrode of the G sub pixel is contacted, and a distance between a pad to which the anode electrode of the G sub pixel is contacted and a pad to which the anode electrode of the B sub pixel is contacted. The conduction film manufacturing machine may be configured to coat the mixed solution to the area in which the conduction film 120 is bonded with the pad 111 from among the whole area of the base film based on the stored information on the size of the pad 111 and the distance between the plurality of pads 111.

As described above, according to an embodiment, the black pattern may be formed on the surface of the conduction film 120 through the inkjet method, or the like. Accordingly, as in FIG. 11, the conduction particles 121 may be distributed to the area which is bonded with the pad 111 from among the whole area of the conduction film 120, and the conduction film 120 of which the surface is applied with the black pattern may be provided.

Alternatively, an embodiment may provide, through the first process of mixing the plurality of black powder particles 123 and the resin 122 through the binder, the second process of drying after coating the mixed solution in which the plurality of black powder particles 123 and the resin 122 are mixed to the whole area of the base film, and the third process of drying after coating the mixed solution in which the plurality of conduction particles 121 and the resin 122 are mixed to the area which is bonded with the pad 111 from among the whole area of the base film, a conduction film 120 in which conduction particles 121 are distributed to an area which bonds with the pad 111 from among the whole area of the conduction film 120 and the inside is black color treated by the black powder particles as in FIG. 12.

As described above, by distributing the conduction particles 121 to only the area which bonds with the pad 111 from among the whole area of the conduction film 120, the manufacturing cost of the conduction film 120 may be lowered and the display device 130 and a circuit of the substrate 110 may be electrically connected. In addition, even in this case, a screen with a deep black color representation may be provided in that the surface or the inside of the conduction film 120 is black color treated.

Figure 13:
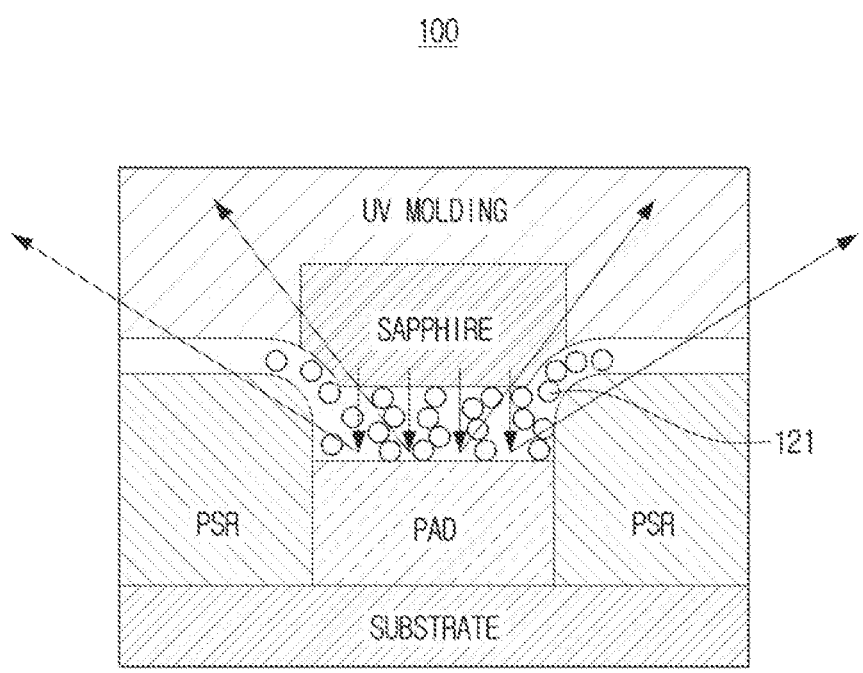
FIG. 13 is a diagram illustrating a display module including conduction particles coated with a light reflective material according to an embodiment.

FIG. 13 is a diagram illustrating a display module including conduction particles coated with a light reflective material according to an embodiment.

The surface of each conduction particle 121 according to an embodiment may be coated with a light reflective material. In an example, the conduction particle 121 may be coated with materials capable of reflecting light such as nickel, silver, tin and the like. As described above, the conduction particle 121 coated with the light reflective material may be a silvery-white material.

The coating method of the light reflective material may be applied with various techniques. In an example, through a method of coating light reflective material with a sputtering process to the surface of the polymer ball which is pretreated using methods such as plasma treatments, or the like, a method of spray coating which adheres light reflective material in fluid form to the polymer through a spraying machine, or the like, the light reflective material may be coated to the surface of the polymer ball.

As described above, the conduction particles 121 coated with the light reflective material may be included in the conduction film 120 of which the surface or the inside is black color treated.

Accordingly, the display module 100 according to an embodiment may provide a screen with a deep black color representation through the conduction film 120 of which the surface or the inside is black color treated, and light efficiency may be enhanced through the conduction particles 121 which are coated with the light reflective material.

For example, referring to FIG. 13, it may be shown that the light (specifically, light emitted to the lower side direction of the sapphire) emitted by the sapphire (e.g., an LED) is reflected by the light reflective material on the surface of the conduction particles 121 in the conduction film 120.

Figure 14:
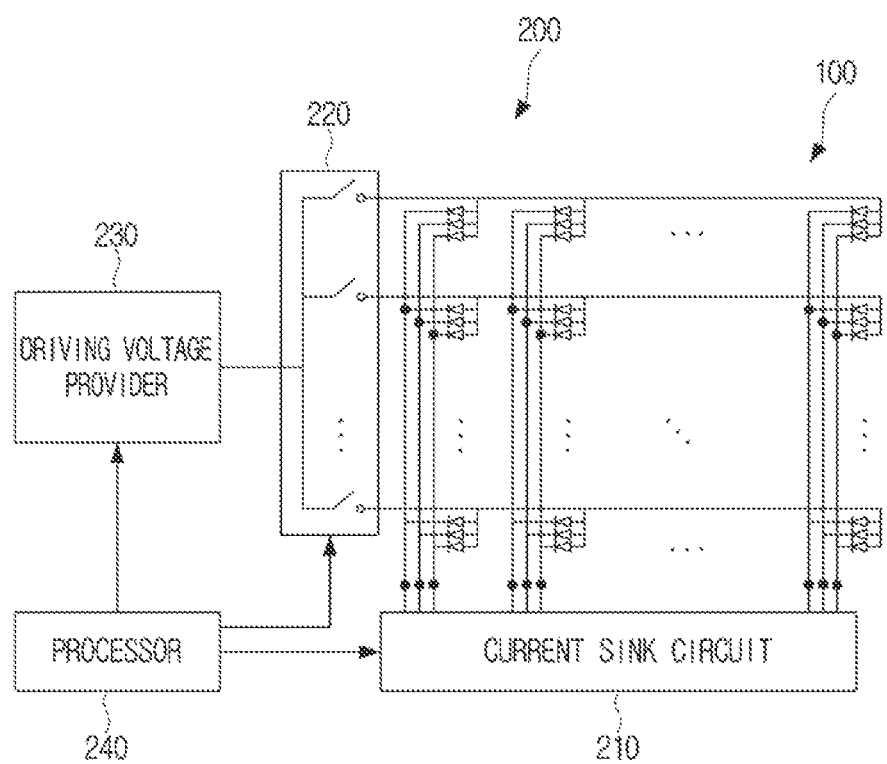
FIG. 14 is a diagram illustrating an operation of a display device including a display module according to an embodiment.

FIG. 14 is a diagram illustrating an operation of a display device including a display module according to an embodiment.

Referring to FIG. 14, the display apparatus 200 may include a plurality of display modules 100, a current sink circuit 210, a plurality of switches 220, a driving voltage provider 230, and a processor 240.

The plurality of switches 220 may be provided for each row line of the display modules 100. Further, one end of the plurality of switches 220 may be configured to connect with the driving voltage provider 230, driving voltage provided by the driving voltage provider 230 may be applied, and the other end may be configured to connect to a common anode terminal for each row line.

As described above, the plurality of switches 220 may be implemented as field effect transistors (FETs), but embodiments are not limited thereto.

The driving voltage provider 230 may be configured to provide a plurality of driving voltages of different magnitudes to the display module 100 through the plurality of switches 220. To this end, the driving voltage provider 230 may include a switching mode power supply (SMPS), a power management IC (PMIC), a DC/DC converter, and the like.

As described above, the display module 100 described herein may be a module to which the black color treated conduction film 120 is bonded.

The processor 240 may be configured to sequentially turn-on the plurality of switches 220 so that the driving voltage may be applied to the display module 100 in units of row lines.

In addition, the processor 240 may be configured to control the current sink circuit 210 so that the driving current flows to the display devices which include the pixels disposed to the row lines corresponding to the turned-on switches.

The driving method as described above may be an operation of the display apparatus 200 which displays an image according to a passive matrix (PM) driving method. However, according to an embodiment, the display apparatus 200 may be configured to display an image according to an active matrix (AM) driving method.

Further, even in the case of the display apparatus which displays an image according to the AM driving method, the display module 100 may be implemented as a module to which the black color treated conduction film 120 is bonded. In an example, the black color treated conduction film 120 may be bonded between the display device 130 and a thin film transistor (TFT).

Figure 15:
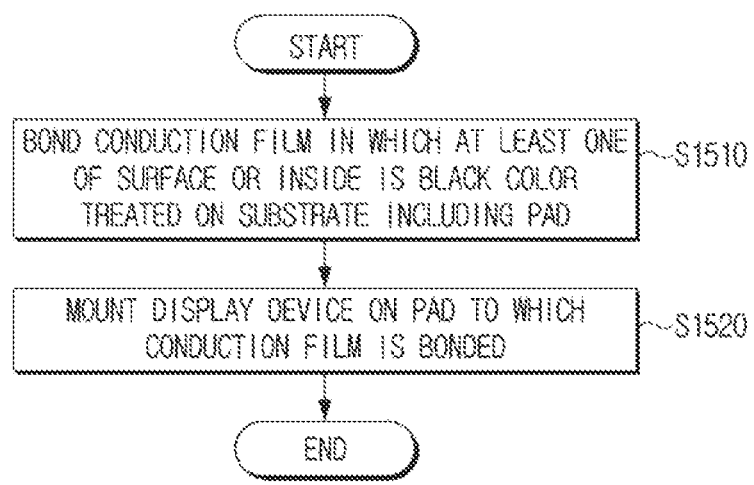
FIG. 15 is a flow chart illustrating a manufacturing method of a display module according to an embodiment.

FIG. 15 is a flow chart illustrating a manufacturing method of a display module according to an embodiment.

The display module 100 according to an embodiment may be manufactured through bonding the conduction film 120 in which at least one of the surface or the inside is black color treated on the substrate 110 including the pad 111 (S1510) and mounting the display device 130 on the pad 111 to which the conduction film 120 is bonded (S1520).

The surface of the conduction film 120 may include the black color pattern, and the black color pattern may be formed based on the black color liquid sprayed to the surface of the conduction film 120 through the inkjet process, the dispensing process, or the like.

Alternatively, the inside of the conduction film 120 may include the black color powder. The black color powder may be a chromium alloyed Cr-Copper, but is not limited thereto.

In addition, the conduction film 120 according to an embodiment may be configured so that the inside includes the black powder 123, and the surface includes the black pattern.

The conduction film 120 may not only include the plurality of conduction particles 121 distributed uniformly throughout the whole area of the conduction film 120, but also the plurality of conduction particles 121 distributed only to the area which bonds with the pad 111 on the substrate 111.

In addition, the conduction particles 121 included in the conduction film 120 may be coated with a material that reflects light emitted by the display device 130. The light reflecting material may be nickel, silver, tin, and the like, but embodiments are not limited thereto.

According to an embodiment, the printed circuit board including the pad 111 for adhering the electronic component and the conduction film 120 which is bonded on pad 111 and at least one of the surface or the inside is black color treated may be provided.

Here, the conduction film 120 may be configured such that the surface is black color treated or the inside is black color treated, as described above. The detailed description thereof has been described above and will be omitted here.

According to various embodiments as described above, the disclosure may provide a screen with a deep black color representation through a black color treated conduction film, and a solution for the problem of light efficiency degradation generated by a black side fill.

A non-transitory computer readable medium stored with a program which sequentially performs the manufacturing method of the display module according to an embodiment may be provided.

The non-transitory computer readable medium may refer to a medium that stores data semi-permanently rather than storing data for a very short time, such as a register, a cache, a memory, or the like, and is readable by a device. Specifically, the above described various applications or programs may be stored and provided in the non-transitory computer readable medium such as, for example, and without limitation, a compact disc (CD), a digital versatile disc (DVD), a hard disc, a Blu-ray disc, a USB, a memory card, a read only memory (ROM), and the like.

While the disclosure has been illustrated and described with reference to various example embodiments thereof, it will be understood that the various example embodiments are intended to be illustrative, not limiting. It will be understood by those skilled in the art that various changes in form and details may be made therein without departing from the true spirit and full scope of the disclosure, including the appended claims and their equivalents.

What is claimed is:

1. A display module, comprising:
   a substrate;
   a plurality of pads spaced from each other and disposed on the substrate;
   a conduction film bonded to the plurality of pads disposed on the substrate, wherein at least one of a surface of the conduction film or an inner portion of the conduction film is black color treated; and
   a display device mounted on the plurality of pads to which the conduction film is bonded,
   wherein the conduction film is configured to electrically connect the display device to the plurality of pads disposed on the substrate,
   wherein the conduction film comprises a plurality of conduction particles in a first portion of the conduction film where the plurality of pads are bonded to the conduction film,
   wherein the first portion of the conduction film comprises conduction particles, among the plurality of conduction particles, that are adhered to one another to form an electrical connection between a corresponding pad of the plurality of pads and the display device, and
   wherein the at least one of the surface of the conduction film or the inner portion of the conduction film that is black color treated is disposed between the plurality of pads and the display device.

2. The display module of claim 1, wherein the surface of the conduction film comprises a black color pattern, and
   wherein the black color pattern is formed based on a black color liquid sprayed to the surface of the conduction film through an inkjet process or a dispensing process.

3. The display module of claim 1, wherein the inner portion of the conduction film comprises a black color powder.

4. The display module of claim 3, wherein the black color powder comprises a chromium alloyed Cr-Copper material.

5. The display module of claim 1, wherein the first portion of the conduction film comprises a resin and the conduction particles uniformly distributed in the resin.

6. The display module of claim 1, wherein each of the plurality of conduction particles is coated with a material which reflects light emitted by the display device.

7. The display module of claim 6, wherein a surface of each of the plurality of conduction particles is coated with nickel, silver or tin.

8. A method of manufacturing a display module, the method comprising:
bonding a conduction film comprising a plurality of conduction particles to a plurality of pads disposed on a substrate, wherein the plurality of pads are spaced apart on the substrate, and at least one of a surface of the conduction film or an inner portion of the conduction film is black color treated; and
mounting a display device on the plurality of pads to which the conduction film is bonded,
wherein the conduction film is configured to electrically connect the display device to the plurality of pads disposed on the substrate,
wherein the conduction film comprises the plurality of conduction particles in a first portion of the conduction film where the plurality of pads are bonded to the conduction film,
wherein the first portion of the conduction film comprises conduction particles, among the plurality of conduction particles, that are adhered to one another to form an electrical connection between a corresponding pad of the plurality of pads and the display device, and
wherein the at least one of the surface of the conduction film or the inner portion of the conduction film that is black color treated is disposed between the plurality of pads and the display device.

9. The method of claim 8, wherein the surface of the conduction film comprises a black color pattern, and
wherein the black color pattern is formed based on a black color liquid sprayed to the surface of the conduction film through an inkjet process or a dispensing process.

10. The method of claim 8, wherein the inner portion of the conduction film comprises a black color powder.

11. The method of claim 10, wherein the black color powder comprises a chromium alloyed Cr-Copper material.

12. The method of claim 8, wherein the first portion of the conduction film comprises a resin and the conduction particles uniformly distributed in the resin.

13. The method of claim 9, wherein each of the plurality of conduction particles is coated with a material which reflects light emitted by the display device.

14. The method of claim 13, wherein a surface of each of the plurality of conduction particles is coated with nickel, silver or tin.

15. A printed circuit board comprising:
a plurality of pads configured to be spaced apart from each other and adhered to an electronic component; and
a conduction film bonded to the plurality of pads,
wherein at least one of a surface of the conduction film or an inner portion of the conduction film is black color treated,
wherein the conduction film is configured to electrically connect the electronic component to the plurality of pads,
wherein the conduction film comprises a plurality of conduction particles in a first portion of the conduction film where the plurality of pads are bonded to the conduction film,
wherein the first portion of the conduction film comprises conduction particles, among the plurality of conduction particles, that are adhered to one another to form an electrical connection between a corresponding pad of the plurality of pads and the electronic component, and
wherein the at least one of the surface of the conduction film or the inner portion of the conduction film that is black color treated is disposed between the plurality of pads and the electronic component.

16. The printed circuit board of claim 15, wherein the surface of the conduction film comprises a black color pattern, and
wherein the black color pattern is formed based on a black color liquid sprayed to the surface of the conduction film through an inkjet process or a dispensing process.

17. The printed circuit board of claim 15, wherein the inner portion of the conduction film comprises a black color powder.

18. The printed circuit board of claim 17, wherein the black color powder comprises a chromium alloyed Cr-Copper material.

* * * * *